(12) United States Patent
Whitmire et al.

(10) Patent No.: US 10,194,535 B1
(45) Date of Patent: Jan. 29, 2019

(54) CAPACITOR ASSEMBLY ADAPTED FOR CIRCUIT BOARD

(71) Applicant: Cornell Dubilier Marketing, Inc., Liberty, SC (US)

(72) Inventors: Phillip Eugene Whitmire, Easley, SC (US); Samuel G. Parler, Jr., Clemson, SC (US); David Eugene Lawson, Pickens, SC (US)

(73) Assignee: Cornell Dubilier Marketing, Inc., Liberty, SC (US)

( * ) Notice: Subject to any disclaimer, the term of this patent is extended or adjusted under 35 U.S.C. 154(b) by 179 days.

(21) Appl. No.: 15/432,396

(22) Filed: Feb. 14, 2017

Related U.S. Application Data

(62) Division of application No. 14/509,225, filed on Oct. 8, 2014, now abandoned.

(51) Int. Cl.
*H05K 3/22* (2006.01)
*H05K 3/34* (2006.01)

(52) U.S. Cl.
CPC .......... *H05K 3/225* (2013.01); *H05K 3/3426* (2013.01)

(58) Field of Classification Search
CPC .. H01G 4/35; H02H 7/16; H05K 1/16; H05K 1/181; H05K 3/225; H05K 3/3426
See application file for complete search history.

(56) References Cited

U.S. PATENT DOCUMENTS

| 5,333,095 | A | * | 7/1994 | Stevenson | A61N 1/3754 29/25.42 |
|---|---|---|---|---|---|
| 6,018,448 | A | * | 1/2000 | Anthony | H01G 4/012 257/E23.079 |
| 8,422,195 | B2 | * | 4/2013 | Stevenson | H01G 4/35 361/302 |
| 2011/0147062 | A1 | * | 6/2011 | Stevenson | H01G 4/35 174/260 |
| 2014/0104776 | A1 | * | 4/2014 | Clayton | H05K 1/181 361/679.31 |
| 2016/0227652 | A1 | * | 8/2016 | Clayton | H05K 3/363 |

* cited by examiner

*Primary Examiner* — Carl Arbes
(74) *Attorney, Agent, or Firm* — Timothy J. Monahan; Monahan & Company, LLC

(57) ABSTRACT

A capacitor assembly is providing for adapting a replacement capacitor to an existing circuit board layout. The capacitor assembly has an adapter with a plate and the replacement capacitor affixed thereto, and the adapter has terminals which are connected to the leads of the replacement capacitor. The adapter further has leads, such as pins, extending downward from the plate, to electrically connect the capacitor assembly to the circuit board.

15 Claims, 4 Drawing Sheets

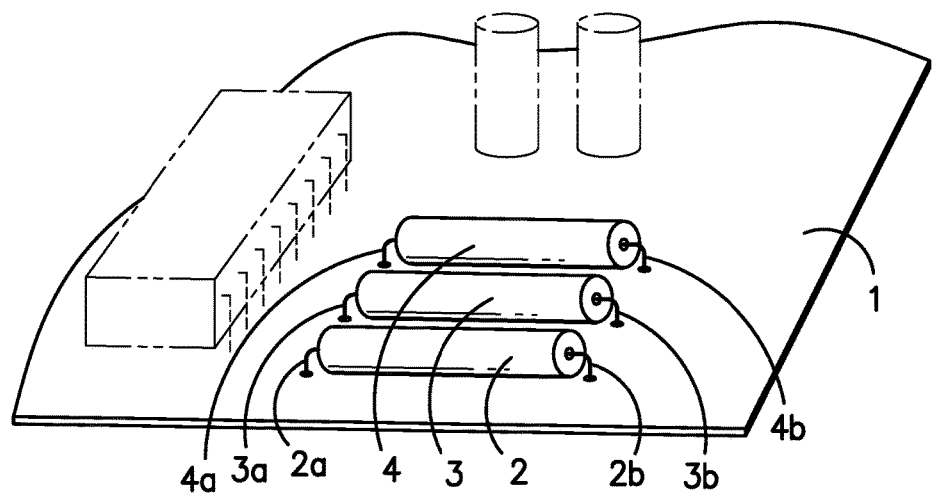
FIG. -1-
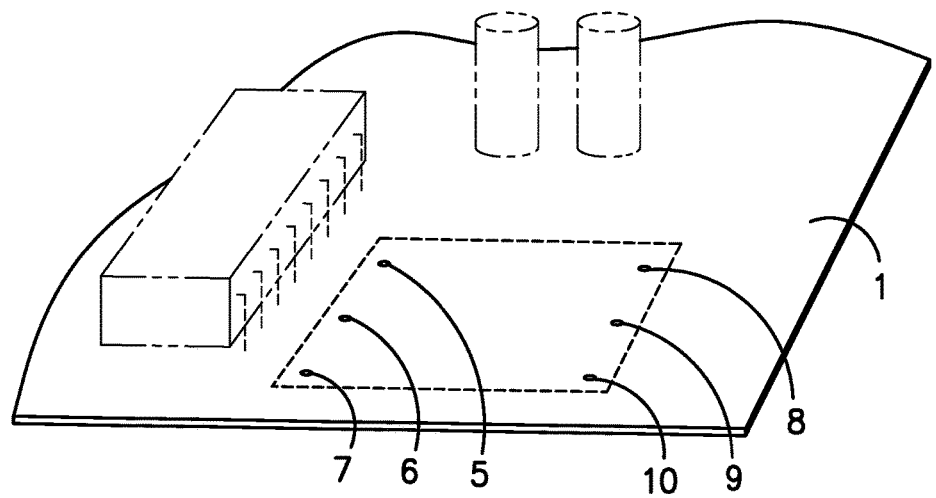
FIG. -2-

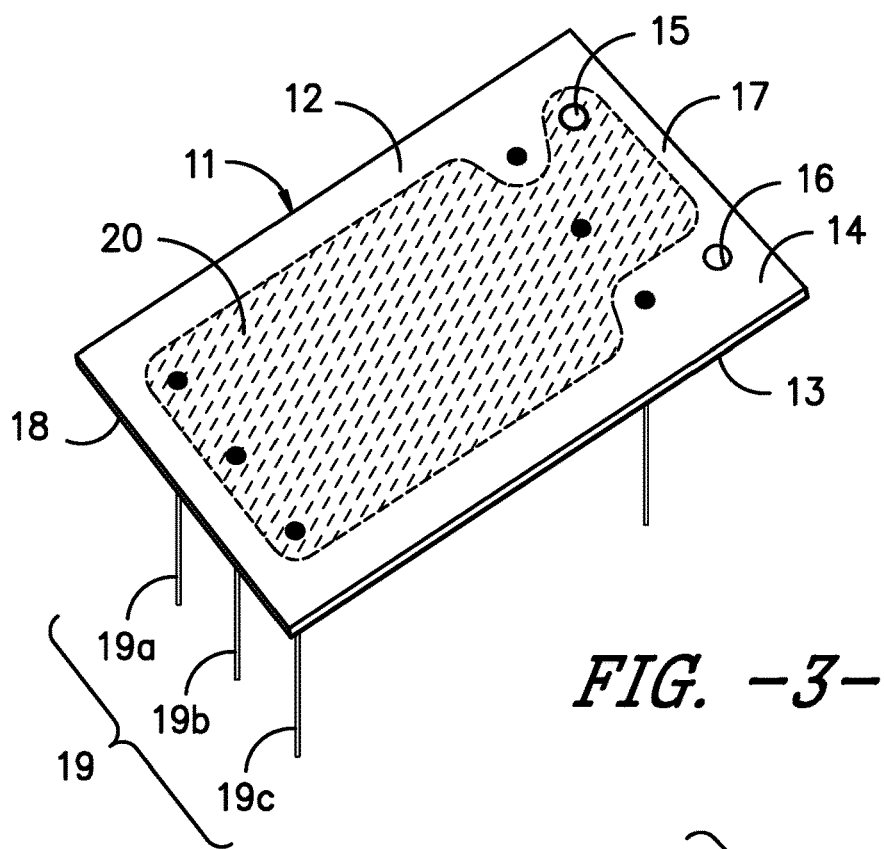
FIG. -3-
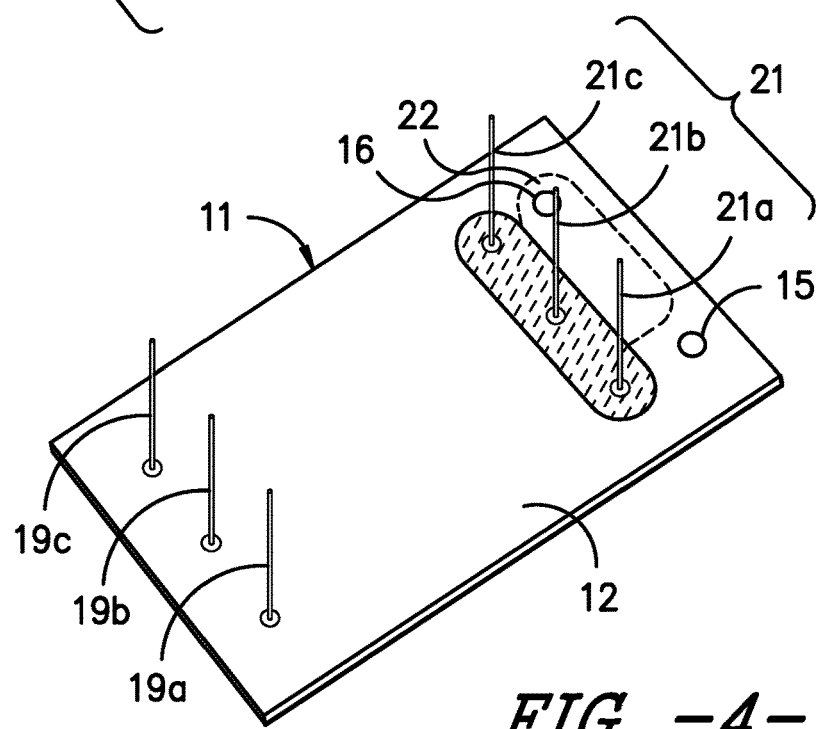
FIG. -4-

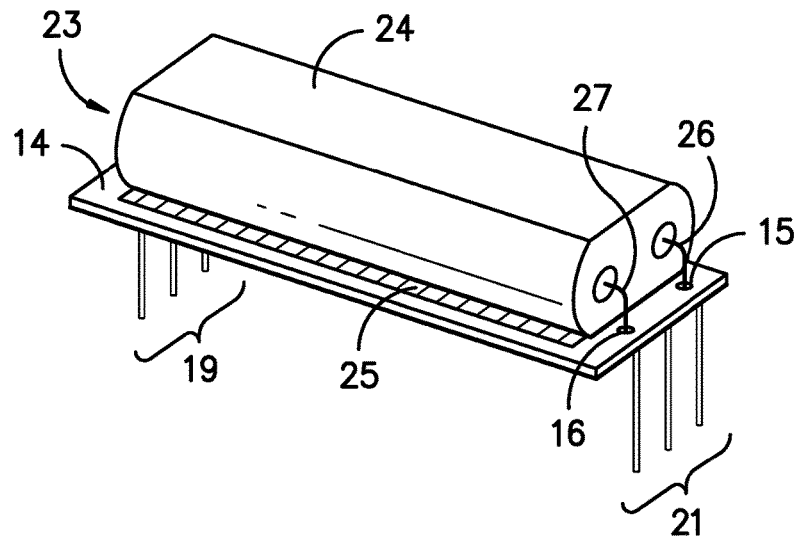
FIG. -5-
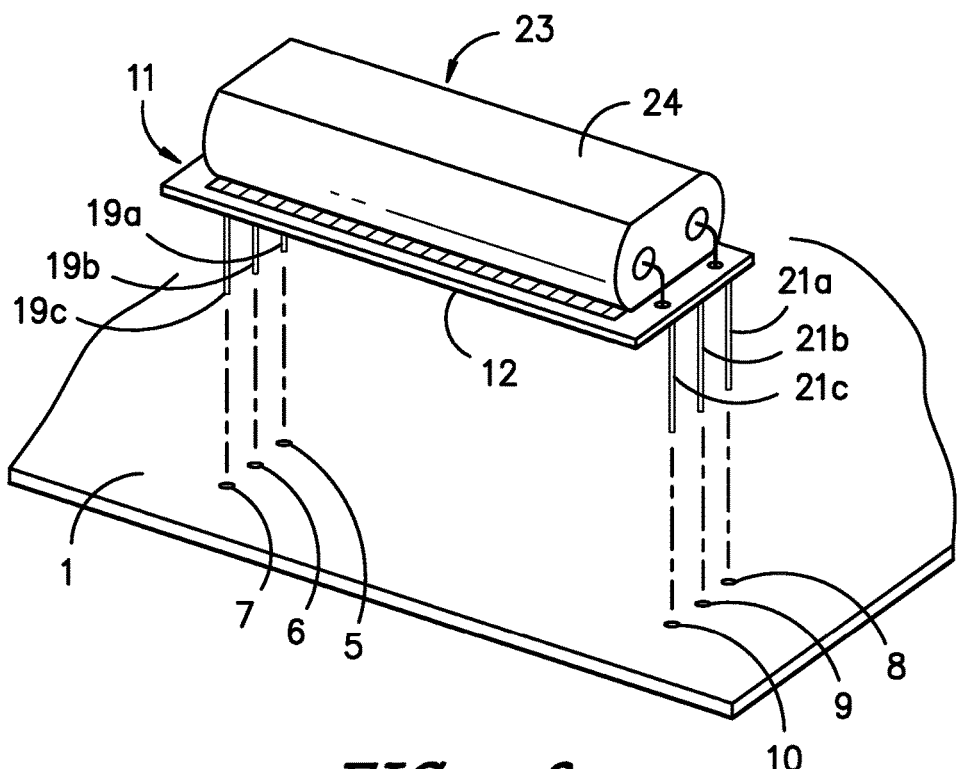
FIG. -6-

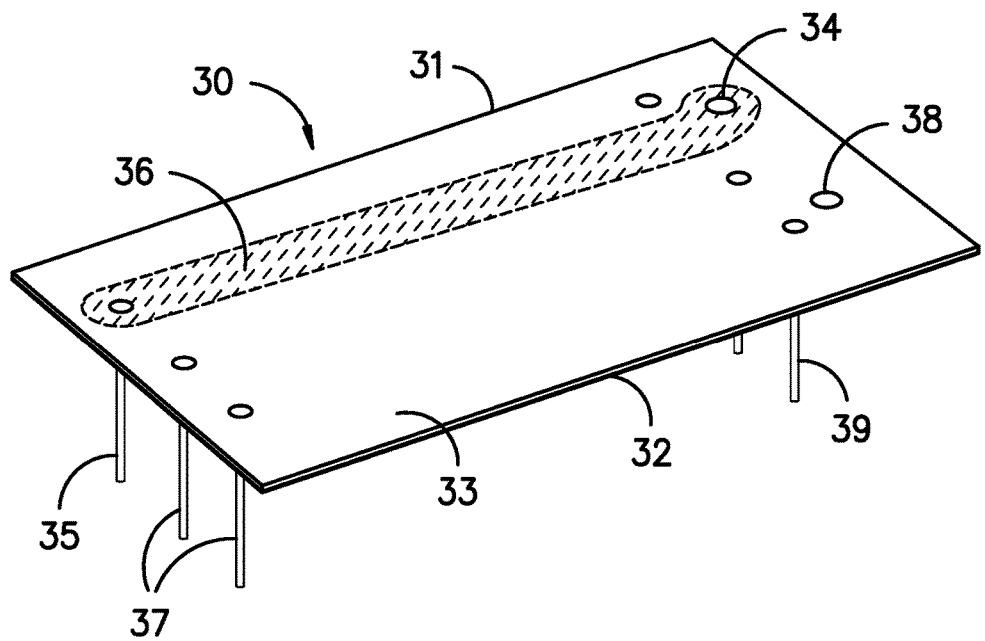
FIG. -7-
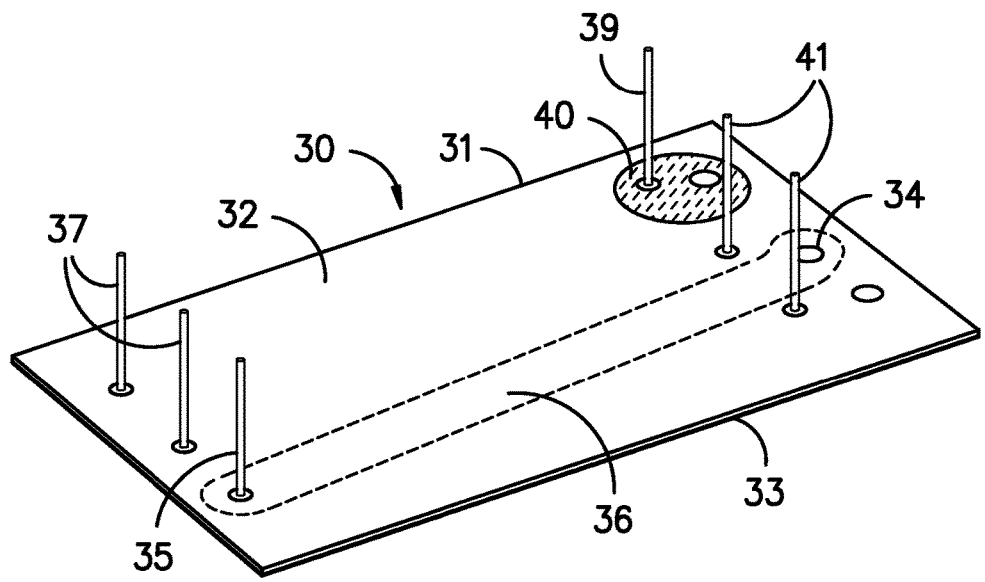
FIG. -8-

CAPACITOR ASSEMBLY ADAPTED FOR CIRCUIT BOARD

This invention is directed to an adapter to allow one or more capacitors on a circuit board to be replaced with one or more capacitors. The adapter has a plate and the replacement capacitor(s) is electrically connecting to and supported by the plate. The adapter includes leads extending downward, which allow the adapter to be electrically connected to the circuit board in the location where the original capacitors were connected.

BACKGROUND OF THE INVENTION

A circuit board may be designed with multiple capacitors located in close proximity to each other. Or the circuit board may be designed to accommodate a capacitor having certain lead configurations, such as leads extending from each end of the capacitor or both leads extending from the same end of the capacitor. Accordingly, the circuit board will have through-holes therein or solder pads for surface-mount technology arranged to accommodate the capacitor(s) specified for the electrical circuit.

It may be desirable to replace multiple capacitors with a single capacitor or different capacitors, or to replace one capacitor with another capacitor that has a different lead configuration, size or shape. If a circuit board has already been manufactured with a specific capacitor or arrangement of multiple capacitors in mind, it is generally difficult to modify the circuit board to accommodate the replacement capacitor. Furthermore, prior to finalizing any decision to employ a replacement capacitor and perhaps redesign the circuit board, testing of the replacement capacitor in the electrical circuit of interest should be conducted. If the replacement capacitor does not correspond to the existing circuit board design, testing may be difficult, and in instances where the circuit is tested for physical integrity, such as high g-force applications, testing may not be possible.

SUMMARY OF THE INVENTION

An adapter is provided to meet the needs and overcome the aforementioned shortcomings in the prior art. The adapter has a plate with an inner face, which is positioned adjacent the circuit board, and an outer face, where a replacement capacitor is affixed. The replacement capacitor has at least two leads, typically representing the anode and the cathode of the capacitor. One of the leads of the capacitor is electrically connected to a first terminal on the adapter plate and the other lead of the capacitor is electrically connect to a second terminal on the adapter plate. The replacement capacitor may have more than two leads, for example, in the case of a concentrically wound, multi-capacitor. In an alternative embodiment, the original capacitors may be replaced with two or more individual capacitors. Accordingly, the adapter is provided with a sufficient number of terminals to electrically connect two or more pairs of leads from the replacement capacitor(s), as needed.

The terminals of the adapter plate can be provided to accommodate the termination style of the replacement capacitor. By way of example, the terminals may be connected to capacitors having axial leads, radial leads, tabs, screw terminals or snap-in leads. Alternatively, the replacement capacitor may be electrically connected to the terminals of the adapter plate by surface mount technology, such as solder pads provided on the adapter plate.

The capacitor is affixed to the outer surface of the adapter plate, with sufficient strength to withstand the rigors of testing and operation. By way of example, the capacitor may be affixed with an adhesive, such as a double-sided tape having an adhesive layer bonded to the capacitor case and an opposite adhesive layer bonded to the outer face of the adapter plate.

The first terminal on the adapter plate is electrically connected via a pathway to the first connector, which has one, two, three or more pins extending downward from the inner face of the plate. The number and arrangement of pins provided by the first connector are selected to engage the circuit board in one or more locations where the original capacitors were located. It can be understood that a single lead of the replacement capacitor is electrically connected to one or more pins, which pins may be arranged to engage the circuit board in approximately the same location as the corresponding leads of the capacitor(s) being replaced.

The second terminal of the adapter plate is electrically connected via a pathway to the second connector, which has one, two, three or more pins extending downward from the inner face of the plate. The number and arrangement of pins provided by the second connector are selected to engage the circuit board in one or more locations where the original capacitors were located. Accordingly, the second lead of the replacement capacitor is electrically connected to one or more pins, which pins may be arranged to engage the circuit board in approximately the same location as the corresponding leads of capacitor(s) being replaced.

The present invention also includes a method of replacing one or more capacitors on a circuit board. The method includes providing an adapter, such as the apparatus described above, affixing the replacement capacitor to the outer face of the adapter plate, electrically connecting the leads of the capacitor to the corresponding terminals of the adapter, and electrically connecting the pins of the first connector and the pins of the second connector to the circuit board, at the locations on the circuit board where the capacitor(s) being replaced would have been connected, to achieve the desired current flow.

The capacitor assembly of the present invention may be connected to the circuit board to replace capacitors connected in parallel, series, or a combination of parallel and series.

BRIEF DESCRIPTION OF THE DRAWINGS

FIG. 1 is a top perspective view of a circuit board showing multiple capacitors connected thereto.

FIG. 2 is a top perspective view of the circuit board showing the multiple capacitors removed.

FIG. 3 is a top perspective view of the outer face of the adapter.

FIG. 4 is a top perspective view of the inner face of the adapter.

FIG. 5 is a top perspective view of the capacitor assembly having a replacement capacitor affixed to the outer face of the adapter.

FIG. 6 is an exploded perspective view of the capacitor assembly and circuit board.

FIG. 7 is a top perspective view of the outer face of an adapter for replacing multiple capacitors connected in series.

FIG. 8 is a top perspective view of the inner face of an adapter for replacing multiple capacitors connected in series.

DETAILED DESCRIPTION OF THE INVENTION

Without intending to limit the scope of the invention, the preferred embodiments and features are hereinafter set forth.

All United States patents cited in the specification are incorporated herein by reference.

Referring to FIGS. 1 and 2, circuit board 1 has capacitors 2, 3 and 4, having axial leads 2a and 2b, 3a and 3b and 4a and 4b, respectively. Leads 2a, 3a and 4a are electrically connected to circuit board 1 at through-holes 7, 6 and 5, respectively. Leads 2b, 3b and 4b are electrically connected to circuit board 1 at through-holes 10, 9 and 8, respectively. By way of example, capacitors 2, 3 and 4 are connected in the circuit in parallel.

Referring to FIGS. 3 and 4, adapter 11 has plate 12, with inner face 13 and outer face 14. Terminal 15 and terminal 16 are provided for electrically connecting two leads from a replacement capacitor to adapter 11. Terminals 15 and 16 are shown positioned at end 17 of plate 12, to accommodate a replacement capacitor having both leads at one end. It can be understood that terminal 15 and 16 may be placed virtually anywhere on plate 12, for example terminal 15 may be positioned at end 17 and terminal 16 may be positioned at end 18 of plate 12, to accommodate a replacement capacitor having terminals at opposite ends.

Adapter 11 has connector 19 having pins 19a, 19b and 19c extending outward from inner face 13 of plate 12. Connector 19 is electrically connected to terminal 15 by a conductive pathway, such as conductive sheet 20, embedded in plate 12. Referring to FIG. 4, adapter 11 also has connector 21 having pins 21a, 21b and 21c. Connector 21 is electrically connected to terminal 16 by a conductive pathway, such as conductive sheet 22. Conductive sheet 22 may be partially or completely embedded in plate 12. Conductive sheet 20 and conductive sheet 22 are electrically insulated from each other, for example, by being inlaid in plate 12 in separate stratum.

In the example illustrated in FIGS. 3 and 4, the pins of one connector, for example 19a-19c, are aligned parallel to the pins of the other connector, 21a-21c, with the two sets of pins being aligned along opposite edges of plate 12.

The non-conductive portions of adapter 11 may be any suitable material, for example, epoxy resin. The adapter may be manufactured according to methods known to those skilled in the art, such as printed circuit board and flexible circuit board assembly. A laminate assembly process may be employed, with layering of conductive and non-conductive materials and specific points of entry and exit forming an isolated electric path for the desired current and voltage.

Referring to FIG. 5, capacitor assembly 23 has replacement capacitor 24 affixed to adapter 11 by an adhesive. The adhesive may be double-sided adhesive tape 25 having one side bonded to the outer face 14 of plate 12 and the opposite side of tape 25 is bonded to the underside of capacitor 24. By way of example, the double-sided tape may be an acrylic foam tape with a pressure activated adhesive. Alternatively, capacitor 24 may be affixed to the outer face 14 of plate 12 by an adhesive used alone or applied to both sides of a different substrate, or by lead frame welding, ultrasonic welding, snap fit or locking tabs or solder bond. Capacitor 24 has leads 26 and 27 electrically connected to terminals 15 and 16, respectively. In one embodiment of the invention, capacitor assembly 23 is stable up to 30 g-force, or even 80 g-force, as tested according to the military standards in effect on Jan. 1, 2013, namely MIL-STD-202G, Method 204, Test Condition H, Vibration—High Frequency.

The invention is illustrated with through-holes in the circuit board and pins for the leads extending from the adapter. Alternatively, the connectors extending from the adapter plate may be selected to accommodate the termination style required for the particular circuit board. By way of example, the connectors of the capacitor assembly may be electrically connected to the circuit board by tabs, screw terminals, snap-ins or by soldering or surface mount technology.

FIG. 6 shows an exploded view of capacitor assembly 23 and circuit board 1. Pins 19a, 19b and 19c of connector 19 are inserted in through-holes 5, 6 and 7 of circuit board 1, respectively. Likewise, pins 21a, 21b and 21c of connector 21 are inserted in through-holes 8, 9 and 10 of circuit board 1.

Generally, the function of connectors 19 and 21 is to electrically connect one of the terminals 15 or 16 on plate 12 to each location on circuit board 1 where the leads of one or more capacitors being replaced are located. In the example illustrated in FIGS. 3-6, lead 26 of capacitor 24 is electrically connected through terminal 15 and sheet 20 to pins 19a-19c. And, lead 27 of capacitor 24 is connected through terminal 16 and sheet 22 to pins 21a-21c. Accordingly, replacement capacitor 24 can be connected to circuit board 1 in parallel.

It can be understood that the pins extending from plate 12 can be provided in virtually any configuration to match the number and arrangement of the connections points on circuit board 1, which represent the capacitors being replaced. For example, the shape of conductive sheets 20 and 22 can be modified so that a pin in a particular location on plate 12 can be connected to either terminal 15 or 16, depending on the polarity requirements, if any, of the capacitor and circuit board 1.

The capacitor assembly of the present invention may be used to replace two or more capacitors connected in series. Referring to FIGS. 7 and 8, three individual capacitors connected in series may be replaced by a single capacitor, using the subject adapter. Adapter 30 has plate 31, inner face 32 and outer face 33. Terminal 34 can be connected to a first lead of a replacement capacitor and is electrically connected to connector pin 35 via conductive sheet 36. Pins 37 are not electrically connected, but are provided to secure the assembly to a circuit board. Terminal 38 can be connected to a second lead of a replacement capacitor and is electrically connected to connector pin 39 via conductive sheet 40. Pins 41 are not electrically connected.

The present invention is not intended to be limited to a particular type of capacitor. By way of example, suitable replacement capacitors and capacitors that can be replaced include electrolytic capacitors, including aluminum and tantalum capacitors, film capacitors, ceramic capacitors, mica capacitors, and supercapacitors, such as electric double layer capacitors (EDLC), pseudocapacitors and hybrid capacitors. The capacitor may be a multi-capacitor comprised of two or more concentrically wound sections or two or more capacitors within a single housing or multiple housings. The leads can be connected or selected to provide the desired replacement capacitance. The shape of the replacement capacitor may be constrained by the space on the circuit board, but otherwise the shape of the capacitor may be cylindrical, oval or flattened (rectangular prism). The capacitors may range in values from 1 pF to 2 F.

There are, of course, many alternative embodiments and modifications of the invention, which are intended to be included in the following claims.

We claim:

1. A method of replacing two or more capacitors on a circuit board, comprising the steps of:
   (a) providing a replacement capacitor having first and second leads;

(b) providing a plate having (i) an inner face and an outer face; (ii) a first terminal positioned on the plate and electrically connectable to the first lead of the replacement capacitor; (iii) a first connector having at least two leads extending outward from the inner face of the plate, for electrically connecting the first connector to the circuit board in two locations; (iv) a first pathway electrically connecting the first terminal to the first connector; (v) a second terminal positioned on the plate and electrically connectable to the second lead of the replacement capacitor; (vii) a second connector having at least two leads extending outward from the inner face of the plate, for electrically connecting the second connector to the circuit board in two locations; and (viii) a second pathway electrically connecting the second terminal to the second connector;

(c) affixing the capacitor to the outer face of the plate and electrically connecting the first lead of the replacement capacitor to the first terminal of the plate and electrically connecting the second lead of the replacement capacitor to the second terminal of the plate; and (d) electrically connecting the leads of the first connector and the leads of the second connector to the circuit board, in the location previously occupied by the two or more capacitors being replaced.

2. The method of claim 1, wherein the replacement capacitor is affixed to the plate by an adhesive.

3. The method of claim 1, wherein the at least two leads of the first connector comprise two pins extending outward from the inner face of the plate, and the at least two leads of the second connector comprise two pins extending outward from the inner face of the plate, and wherein the replacement capacitor is a single capacitor, which replaces at least two capacitors on the circuit board.

4. The method of claim 1, wherein the at least two leads of the first connector comprise three pins extending outward from the inner face of the plate, and the at least two leads of the second connector comprise three pins extending outward from the inner face of the plate, and wherein the replacement capacitor is a single capacitor, which replaces at least three capacitors on the circuit board.

5. The method of claim 4, wherein the first connector is positioned at a first end of the plate and the second connector is positioned at a second end of the plate, whereby the first end of the plate is opposite the second end of the plate, and the three pins of the first connector are aligned parallel to the three pins of the second connector.

6. The method of claim 1, wherein the first pathway comprises a first conductive sheet electrically connected to the two pins of the first connector, and the second pathway comprises a second conductive sheet electrically connected to the two pins of the second connector.

7. The method of claim 6, wherein at least one of the first conductive sheet and the second conductive sheet is embedded in the plate.

8. The method of claim 1, wherein the first connector is positioned at a first end of the plate and the second connector is positioned at a second end of the plate, whereby the first end of the plate is opposite the second end of the plate.

9. The method of claim 8, wherein the first terminal and the second terminal are both positioned at either the first end or the second end of the plate.

10. The method of claim 1, wherein the first connector comprises three pins extending outward from the inner face of the plate, and wherein the second connector comprises three pins extending outward from the inner face of the plate.

11. The method of claim 10, wherein the first connector is positioned at a first end of the plate and the second connector is positioned at a second end of the plate, whereby the first end of the plate is opposite the second end of the plate, and the three pins of the first connector are aligned parallel to the three pins of the second connector.

12. The method of claim 11, wherein the first terminal and the second terminal are both positioned at either the first end or the second end of the plate.

13. The method of claim 10, wherein the first pathway comprises a first conductive sheet electrically connected to the three pins of the first connector, and the second pathway comprises a second conductive sheet electrically connected to the three pins of the second connector.

14. The method of claim 13, wherein at least one of the first conductive sheet and the second conductive sheet is embedded in the plate.

15. The method of claim 1, wherein the replacement capacitor is affixed to the plate by a double-faced adhesive tape having one side bonded to the outer face of the plate and an opposite side bonded to the replacement capacitor.

* * * * *